(12) United States Patent
Zhou et al.

(10) Patent No.: US 10,204,876 B2
(45) Date of Patent: Feb. 12, 2019

(54) PAD DEFINED CONTACT FOR WAFER LEVEL PACKAGE

(71) Applicant: Maxim Integrated Products, Inc., San Jose, CA (US)

(72) Inventors: Tiao Zhou, Carrollton, TX (US); Ricky Agrawal, Lewisville, TX (US); Abhishek Choudhury, San Jose, CA (US)

(73) Assignee: MAXIM INTEGRATED PRODUCTS, INC., San Jose, CA (US)

( * ) Notice: Subject to any disclaimer, the term of this patent is extended or adjusted under 35 U.S.C. 154(b) by 647 days.

(21) Appl. No.: 13/787,911

(22) Filed: Mar. 7, 2013

(65) Prior Publication Data

US 2014/0252592 A1   Sep. 11, 2014

(51) Int. Cl.
*H01L 23/12* (2006.01)
*H01L 23/13* (2006.01)
(Continued)

(52) U.S. Cl.
CPC .......... *H01L 24/05* (2013.01); *H01L 23/3192* (2013.01); *H01L 24/02* (2013.01);
(Continued)

(58) Field of Classification Search
CPC ....... H01L 2224/023; H01L 2224/0231; H01L 2224/0233–2224/0239;
(Continued)

(56) References Cited

U.S. PATENT DOCUMENTS 6,211,576 B1 * 4/2001 Shimizu .................. H01L 23/50
257/673
6,362,087 B1 * 3/2002 Wang et al. ................... 438/597
(Continued)

FOREIGN PATENT DOCUMENTS

CN    102347253 A    2/2012

OTHER PUBLICATIONS

Office Action dated Aug. 30, 2017 for Chinese Appln. No. 201410082088.6.
(Continued)

*Primary Examiner* — Maliheh Malek
(74) *Attorney, Agent, or Firm* — Kevin E. West; Advent, LLP

(57) ABSTRACT

A device and fabrication techniques are described that employ wafer-level packaging techniques for fabricating semiconductor devices that include a pad defined contact. In implementations, the wafer-level package device that employs the techniques of the present disclosure includes a substrate, a passivation layer, a top metal contact pad, a thin film with a via formed therein, a redistribution layer structure configured to contact the top metal contact pad, and a dielectric layer on the thin film and the redistribution layer structure. In implementations, a process for fabricating the wafer-level package device that employs the techniques of the present disclosure includes processing a substrate, forming a passivation layer, depositing a top metal contact pad, forming a thin film with a via formed therein, forming a redistribution layer structure in the via formed in the thin film, and forming a dielectric layer on the thin film and the redistribution layer structure.

16 Claims, 4 Drawing Sheets

(51) Int. Cl.
 *H01L 23/00* (2006.01)
 *H01L 23/31* (2006.01)
 *H01L 23/52* (2006.01)
 *H01L 23/522* (2006.01)

(52) U.S. Cl.
 CPC .............. *H01L 24/03* (2013.01); *H01L 24/13* (2013.01); *H01L 24/94* (2013.01); *H01L 2224/024* (2013.01); *H01L 2224/0239* (2013.01); *H01L 2224/02311* (2013.01); *H01L 2224/02321* (2013.01); *H01L 2224/0401* (2013.01); *H01L 2224/05548* (2013.01); *H01L 2224/05569* (2013.01); *H01L 2224/131* (2013.01); *H01L 2224/94* (2013.01); *H01L 2924/14* (2013.01); *H01L 2924/30101* (2013.01)

(58) Field of Classification Search
 CPC ............ H01L 2224/05575–2224/05584; H01L 24/01–24/06; H01L 24/10–24/14; H01L 24/26–24/30; H01L 24/80–24/81; H01L 24/90–24/92; H01L 25/50
 USPC .......................... 438/612–617; 257/E23.015, 257/E23.02–E23.021, E23.037
 See application file for complete search history.

(56) References Cited

U.S. PATENT DOCUMENTS

| | | | | |
|---|---|---|---|---|
| 6,656,826 B2* | 12/2003 | Ishimaru | ............. | H01L 23/5256 257/209 |
| 6,727,118 B2* | 4/2004 | Lasky | ................... | H01L 23/481 257/E21.597 |
| 7,122,458 B2* | 10/2006 | Cheng et al. | ................. | 438/612 |
| 7,274,097 B2* | 9/2007 | Baek | .................. | H01L 23/3114 257/686 |
| 7,682,959 B2* | 3/2010 | Lin et al. | ...................... | 438/612 |
| 7,808,105 B1* | 10/2010 | Paek | .................. | H01L 23/3171 257/750 |
| 7,977,783 B1* | 7/2011 | Park | ........................ | H01L 24/11 257/692 |
| 8,241,954 B2* | 8/2012 | Camacho et al. | ............ | 438/108 |
| 8,259,464 B2* | 9/2012 | Zhou | .................. | H01L 23/3171 361/771 |
| 8,309,452 B2* | 11/2012 | Lin et al. | ...................... | 438/614 |
| 8,389,406 B2* | 3/2013 | Sameshima | ....... | H01L 21/76877 257/758 |
| 8,643,150 B1* | 2/2014 | Xu | ......................... | H01L 24/11 257/632 |
| 8,829,678 B2* | 9/2014 | Lee | .................. | H01L 23/49816 257/737 |
| 8,872,306 B2* | 10/2014 | Jin | ..................... | H01L 23/5256 257/529 |
| 9,171,798 B2* | 10/2015 | Lin | .................. | H01L 23/49811 |
| 9,305,808 B2* | 4/2016 | Lu | .......................... | H01L 25/04 |
| 2005/0266667 A1 | 12/2005 | Huang | | |
| 2006/0103020 A1* | 5/2006 | Tong | ................... | H01L 23/3114 257/738 |
| 2006/0246626 A1 | 11/2006 | Jiang et al. | | |
| 2006/0292711 A1* | 12/2006 | Su | ......................... | G01R 31/046 438/14 |
| 2007/0176290 A1* | 8/2007 | Park | ..................... | H01L 23/3114 257/737 |
| 2008/0211093 A1* | 9/2008 | Ke | ......................... | H01L 24/13 257/738 |
| 2009/0115058 A1* | 5/2009 | Yu | ........................... | H01L 24/11 257/738 |
| 2009/0278263 A1* | 11/2009 | McCarthy | ........... | H01L 23/3114 257/778 |
| 2009/0283905 A1* | 11/2009 | Huang | .................... | H01L 24/10 257/737 |
| 2010/0105200 A1* | 4/2010 | Lin et al. | ....................... | 438/614 |
| 2010/0264516 A1* | 10/2010 | Lin et al. | ...................... | 257/531 |
| 2011/0204515 A1* | 8/2011 | Fazelpour | ........... | H01L 23/3114 257/738 |
| 2011/0221041 A1* | 9/2011 | Lin | ........................ | H01L 21/561 257/620 |
| 2012/0104627 A1 | 5/2012 | Lee | | |
| 2012/0126424 A1* | 5/2012 | Lee | ................. | 257/774 |
| 2012/0193741 A1* | 8/2012 | Borthakur | ......... | H01L 27/14621 257/433 |
| 2012/0276691 A1* | 11/2012 | Camacho | ............ | H01L 23/5389 438/109 |
| 2013/0015555 A1* | 1/2013 | Lin et al. | ....................... | 257/531 |
| 2013/0034956 A1* | 2/2013 | Lei et al. | ...................... | 438/613 |
| 2013/0087892 A1* | 4/2013 | Yew et al. | ..................... | 257/621 |
| 2013/0127052 A1* | 5/2013 | Tu | ........................ | H01L 23/3114 257/738 |
| 2013/0147031 A1* | 6/2013 | Chen et al. | ................... | 257/737 |
| 2013/0228897 A1* | 9/2013 | Chen | ..................... | H01L 24/05 257/621 |
| 2013/0320522 A1* | 12/2013 | Lai et al. | ...................... | 257/737 |
| 2013/0330921 A1* | 12/2013 | Kao et al. | ..................... | 438/612 |
| 2014/0070408 A1* | 3/2014 | So | ....................... | H01L 23/3114 257/737 |
| 2014/0167269 A1* | 6/2014 | Lu | .......................... | H01L 25/04 257/762 |
| 2014/0203438 A1* | 7/2014 | Chen | ..................... | H01L 24/05 257/761 |
| 2014/0211438 A1* | 7/2014 | Lin | ................... | H01L 23/49811 361/767 |
| 2014/0319698 A1* | 10/2014 | Molin | ................... | H01L 23/481 257/774 |
| 2015/0249019 A1* | 9/2015 | Lu | .......................... | H01L 25/04 438/107 |
| 2016/0204079 A1* | 7/2016 | Lu | .......................... | H01L 25/04 257/668 |
| 2016/0233267 A1* | 8/2016 | Borthakur | ......... | H01L 27/14621 |
| 2017/0025342 A1* | 1/2017 | Tseng | ................ | H01L 23/49833 |

OTHER PUBLICATIONS

Office Action in Chinese Patent Appln No. 201410082088.6, dated Oct. 15, 2018.

\* cited by examiner

PAD DEFINED CONTACT FOR WAFER LEVEL PACKAGE

BACKGROUND

Packaging technologies have evolved to develop smaller, cheaper, more reliable, and more environmentally-friendly packages. For example, chip-scale packaging technologies have been developed that employ direct surface mountable packages having a surface area that is no greater than 1.2 times the area of the integrated circuit chip. Wafer-level packaging (WLP) is a chip-scale packaging technology that encompasses a variety of techniques whereby integrated circuit chips are packaged at wafer-level, prior to segmentation. Wafer-level packaging extends the wafer fabrication processes to include device interconnection and device protection processes. Consequently, wafer-level packaging streamlines the manufacturing process by allowing for the integration of wafer fabrication, packaging, testing, and burn-in processes at the wafer-level.

Traditional fabrication processes used in the manufacture of semiconductor devices employ microlithography to pattern integrated circuits onto a circular wafer formed of a semiconductor such as silicon, gallium arsenide, and so forth. Typically, the patterned wafers are segmented into individual integrated circuit chips or dies to separate the integrated circuits from one another. The individual integrated circuit chips are assembled or packaged using a variety of packaging technologies to form semiconductor devices that may be mounted to a printed circuit board.

SUMMARY

A device and fabrication techniques are described that employ wafer-level packaging techniques that include a pad defined contact where a surface of a top metal contact pad is in full contact with a corresponding redistribution layer. The wafer-level package devices provide mechanical protection of the embedded integrated circuit chips (dies) contained within the device packages similar to that provided by other devices while maintaining the benefits inherent in wafer-level packaging (e.g., lower cost, smaller package size, high pin count, etc.). In implementations, the wafer-level package device that employs the techniques of the present disclosure includes a substrate, a passivation layer, a top metal contact pad, a thin film with a via formed therein, a redistribution layer structure configured to contact the top metal contact pad, and a dielectric layer on the thin film and the redistribution layer structure. In implementations, a process for fabricating the wafer-level package device that employs the techniques of the present disclosure includes processing a substrate, forming a passivation layer, depositing a top metal contact pad, forming a thin film with a via formed therein, forming a redistribution layer structure in the via formed in the thin film, and forming a dielectric layer on the thin film and the redistribution layer structure.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Overview

Figure 1:
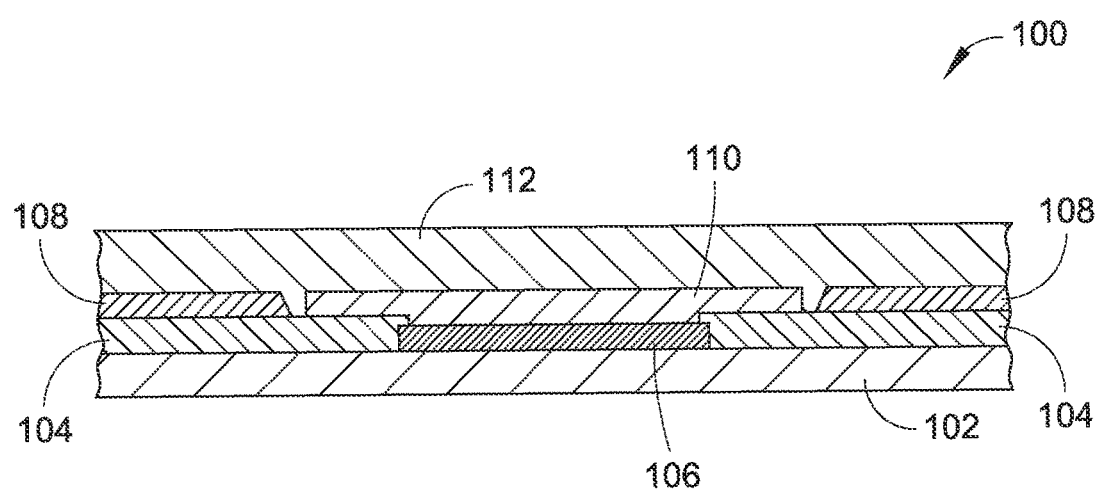
FIG. 1 is a diagrammatic partial cross-sectional side elevation view illustrating a wafer-level package device in accordance with an example implementation of the present disclosure, wherein the wafer-level package device includes a pad defined contact area, a top metal contact pad, a redistribution layer structure, a passivation layer a thin film, and a substrate.

Wafer-level packaging is a chip-scale packaging technology that encompasses a variety of techniques whereby integrated circuit chips are packaged at wafer-level, prior to segmentation. Wafer-level packaging extends the wafer fabrication processes to include device interconnection and device protection processes. Consequently, wafer-level packaging streamlines the manufacturing process by allowing for the integration of wafer fabrication, packaging, testing, and burn-in processes at the wafer-level. Compared to some packaging techniques, wafer-level packaging is generally less costly to implement since packaging occurs at wafer-level, while other types of packaging is performed at strip level.

However, wafer-level package devices include challenges such as redistribution layer routing and contact pad resistance, electromigration and performance issues, process margins, and die size. Contact pad resistance issues include contact resistance variation due to thin film residual on the contact pad, process variation, and the critical dimensions do not linearly scale (i.e., different feature sizes have different process bias). When a contact pad does not fully contact the redistribution layer (e.g., when a portion of the contact pad abuts a passivation or dielectric layer), contact resistance increases, which is undesirable. Additionally, with a via defined contact (e.g., where the contact area between the redistribution layer and the contact pad is determined by the size of a via in a dielectric layer), a smaller contact area exists along with undesirable process variations, such as varying contact area (e.g., a smaller or larger than desired via size, residual material footing in the via, etc.).

Accordingly, a wafer-level package device and techniques are described that include a pad defined contact (e.g., a surface of a top metal contact pad distal from a semiconductor substrate fully abuts a corresponding redistribution layer) for minimizing contact pad resistance. Semiconductor devices with a decreased contact resistance for a given top metal contact pad size may thus be provided providing a greater thin film process margin (e.g., the thin film formation process is less dependent on thin film process variations), provide better space saving (e.g., a smaller top metal contact pad for a given contact area), and allow the contact area between the top metal contact pad and the redistribution layer structure to shrink below 30 μm. In implementations, the wafer-level package device that employs example techniques in accordance with the present disclosure includes a substrate, a top metal contact pad, a passivation layer, a thin film, a redistribution layer structure formed in and defined by the thin film, and a dielectric layer disposed on the thin film and the redistribution layer structure. In an implementation, a process for fabricating the wafer-level package device with a pad defined contact that employs the techniques of the present disclosure includes processing a substrate, forming a passivation layer, depositing a top metal contact pad, forming a thin film with a via formed therein, forming a redistribution layer structure, and forming a dielectric layer on the thin film and the redistribution layer structure. The pad defined contact decreases contact resistance.

Example Implementations

FIG. 1 illustrates a wafer-level package device 100 in accordance with example implementations of the present disclosure. As shown, the wafer-level package device 100 includes a semiconductor substrate 102. In implementations, the wafer-level package device 100 includes a semiconductor substrate 102, sometimes including one or more integrated circuits formed therein. The semiconductor substrate 102 may include a portion of a semiconductor wafer substrate, such as a silicon wafer (e.g., p-type wafer, n-type wafer, and so forth), a germanium wafer, and so forth, that includes one or more integrated circuits formed therein. The integrated circuits may be formed through suitable front-end-of-line (FEOL) fabrication techniques near the surface of the semiconductor wafer substrate. In various implementations, the integrated circuits may include digital integrated circuits, analog integrated circuits, mixed signal integrated circuits, combinations thereof, and so forth. The integrated circuits may be formed through suitable front-end-of-line (FEOL) fabrication techniques. In one embodiment, the semiconductor substrate 102 includes a silicon semiconductor wafer with integrated circuits formed therein, where the silicon semiconductor wafer includes a backside coating.

As shown in FIG. 1, the wafer-level package device 100 includes a passivation layer 104. The passivation layer 104 may be disposed around contact pads (e.g., a top metal contact pad 106) to function as an electrical insulation to the integrated circuits and the contact pads. In implementations, the passivation layer 104 may include a benzocyclobutene (BCB) polymer material, a polyimide (PI) material, a polybenzoxazole (PBO) material, an oxide material (e.g., silicon dioxide (SiO2)), and/or combinations thereof, etc.

The wafer-level package device 100 includes a top metal contact pad 106 (e.g., a contact pad) disposed on the semiconductor substrate 102. In implementations, the top metal contact pad 106 may include a contact pad in one or more area arrays of contact pads deployed over the surface of the semiconductor substrate 102. Additionally, the top metal contact pad 106 may include a designated surface area of the semiconductor substrate 102 configured to function as an electrical contact between electrical components. The number and configuration of top metal contact pad(s) 106 may vary depending on the complexity and configuration of the integrated circuits, the size and shape of the semiconductor substrate 102, and so forth. The top metal contact pad(s) 106 provide electrical contacts through which the integrated circuits in the semiconductor substrate 102 are interconnected to external components such as other semiconductor devices, printed circuit boards, and so forth by way of a redistribution layer structure 110 and other electrical interconnections. In implementations, the top metal contact pad(s) 106 may comprise aluminum, copper, gold, and so forth.

As shown in FIG. 1, the wafer-level package device 100 includes a thin film 108 formed on the passivation layer 104. In implementations, the thin film 108 may include a layer of material configured to function as an electrical insulator. Various materials (e.g., a benzocyclobutene (BCB) polymer material, a polyimide (PI) material, a polybenzoxazole (PBO) material, an oxide material (e.g., silicon dioxide (SiO2)), and/or combinations thereof) may be used as the thin film 108. In a specific implementation, the thin film 108 may include a polybenzoxazole (PBO) material.

Illustrated in FIG. 1, the thin film 108 and the passivation layer 104 includes a via or opening formed therein. The via or opening formed in the thin film 108 and the passivation layer 104 functions to serve as a vertical connection pathway between multiple layers (e.g., the top metal contact pad 104 and the redistribution structure 110) of the wafer-level package device 100. Contact resistance depends on at least two thin film (e.g., PBO) process variations. The first is when the via is smaller than the target (e.g., the top metal contact pad 106). The second is when there is a larger footing at the sidewall of the thin film. In both these cases, the contact resistance is higher.

The wafer-level package device 100 further includes a redistribution layer structure 110 formed on the top metal contact pad 106 and a portion of the passivation layer 104 and disposed adjacent to the thin film 108. In implementations, the redistribution layer structure 110 includes a redistribution layer that functions as a rerouting and interconnection system that redistributes electrical interconnections in the wafer-level package device 100. The redistribution layer electrically interconnects a conductive pad (e.g., the top metal contact pad 106) with another component (e.g., a solder bump, not shown). Additionally, the redistribution layer structure 110 may also include other related interconnection components, such as under-bump metallization (UBM), contact pads, etc.

In implementations, the redistribution layer structure 110 may include a patterned metal thin-film line (e.g., aluminum, copper, etc.). In one specific implementation, the redistribution layer structure 110 includes a patterned thin-film copper line that has been deposited on the top metal contact pad 106 and a portion of the passivation layer 104. In this implementation, the contact between the redistribution layer structure 110 and the top metal contact pad 106 is a "pad defined contact," where the via or opening in the thin film 106 is larger than the via or opening in the passivation layer 104, and the surface of the top metal contact pad distal from the semiconductor substrate 102 abuts and is in full contact with the redistribution layer structure 110. The benefits of this implementation include minimum contact resistance, a better wafer-level package process margin, and less required die area. The redistribution layer structure 110 is electrically isolated from the semiconductor substrate 102 and other components except for connections to, for example, bond pads, contact pads, pillars, or metal runs. In implementations, the redistribution layer structure 110 is configured so that the contact area between the redistribution layer structure 110 and the top metal contact pad 106 is the same as the via in passivation layer 104. In a specific implementation, the top metal contact pad 106 has a size of approximately 30 µm, a passivation layer 104 via size of approximately 30 µm, a thin film 108 opening of approximately 48 µm, and a redistribution layer size of approximately 48 µm. A via defined contact includes a contact where a portion of a surface of the top metal contact pad 106 distal from the semiconductor substrate 102 is in contact with the redistribution layer structure 110 and a portion is in contact with the thin film 108. When a via defined contact is utilized, a contact area the size of the via in the passivation layer 104 between the top metal contact pad 106 and the redistribution layer structure 110 is unachievable due to process variations.

As illustrated in FIG. 1, the wafer-level package device 100 includes a dielectric layer 112 formed on the redistribution layer structure 110 and the thin film 108 that functions to protect the redistribution layer structure 110. In some implementations, the dielectric layer 112 includes a benzocyclobutene (BCB) polymer material, a polyimide (PI) material, a polybenzoxazole (PBO) material, an oxide material (e.g., silicon dioxide (SiO2)), and/or combinations thereof, etc. In some implementations, the dielectric layer 112 may be formed as different layers or in different steps using a suitable deposition method.

Subsequent to forming the dielectric layer 112, additional layers may be added to the wafer-level package device 100 beyond the dielectric layer 112 (e.g., electrical interconnections, encapsulation layers, dielectric and/or passivation layers, and/or layers configured to function as structural support). Further, the wafer-level package device 100 may be singulated into individual semiconductor devices subsequent to the formation of additional layers and coupled to a printed circuit board (not shown), thereby forming an electronic device. A printed circuit board may include a circuit board used to mechanically support and electrically connect electronic components (e.g., the individual semiconductor devices) using conductive pathways, tracks or signal traces etched from copper sheets laminated onto a non-conductive substrate.

Example Fabrication Processes

Figure 2:
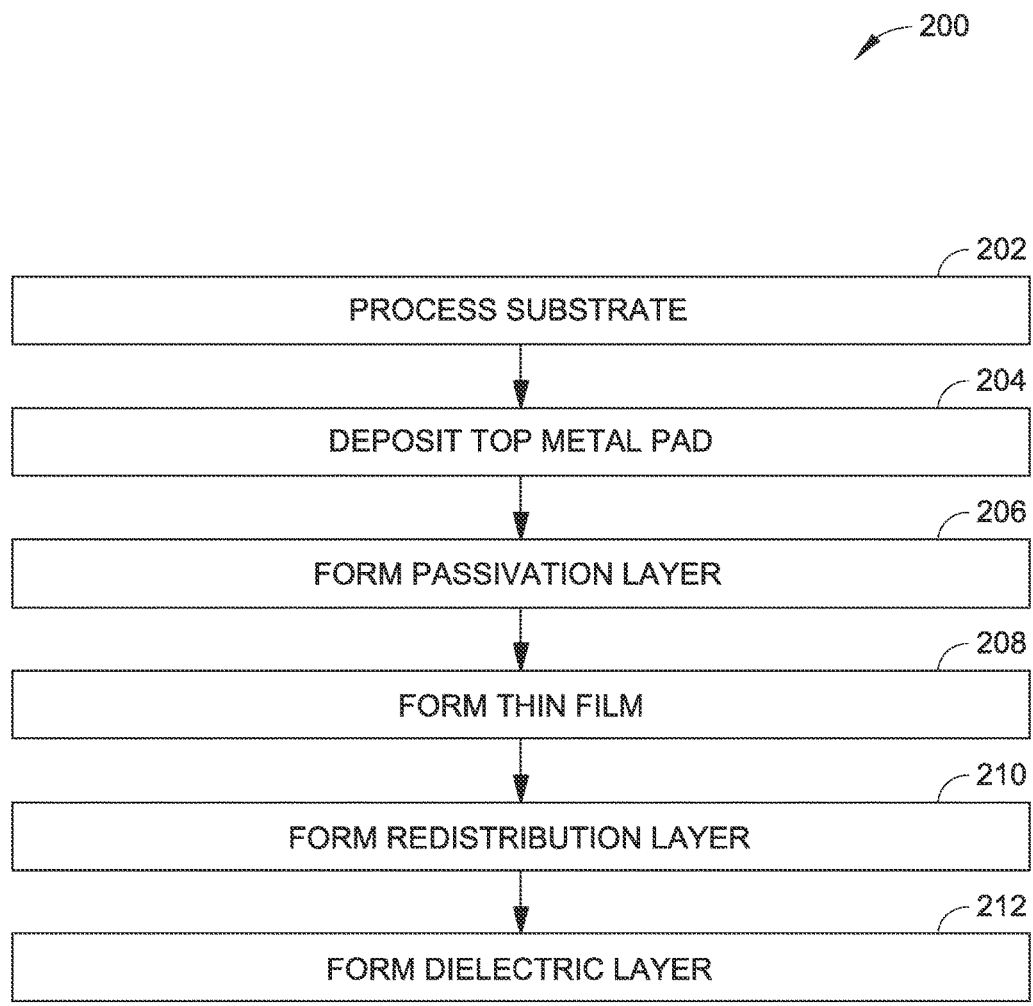
FIG. 2 is a flow diagram illustrating a process in an example implementation for fabricating a wafer-level package device, such as the device shown in FIG. 1.

FIG. 2 illustrates an example process 200 that employs wafer-level packaging techniques to fabricate semiconductor devices including a pad defined contact, such as the wafer-level package device 100 shown in FIG. 1. FIGS. 3A through 3F illustrate sections 300 of an example pad defined contact utilized to fabricate semiconductor devices (such as wafer-level package device 100 shown in FIG. 1).

Figure 3A:
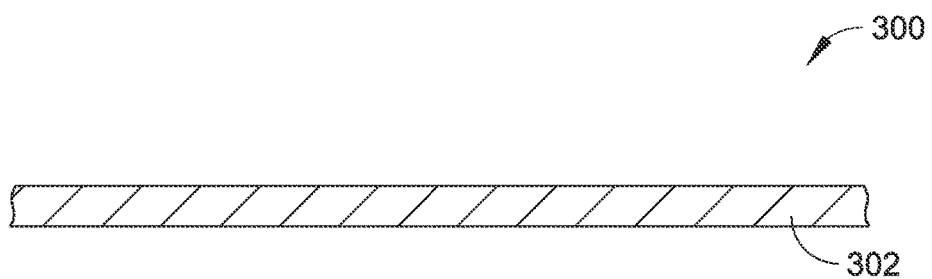
FIGS. 3A through 3F are diagrammatic partial cross-sectional side elevation views illustrating the fabrication of a wafer-level package device, such as the device shown in FIG. 1, in accordance with the process shown in FIG. 2.

Accordingly, a substrate is processed (Block 202). FIG. 3A illustrates a portion of the semiconductor substrate 302, which, when processed through suitable FEOL fabrication techniques, includes a photodefinable dielectric film and/or an integrated circuit substrate that includes one or more integrated circuits formed therein. The processed semiconductor substrate 302 and/or integrated circuits may be configured in a variety of ways. For example, processing the integrated circuits may include processing digital integrated circuits, analog integrated circuits, mixed-signal integrated circuits, etc. The processed integrated circuits are connected to one or more conductive layers (e.g., bump interfaces, redistribution layers, etc.) that provide electrical contacts through which the integrated circuits are interconnected to other components associated with the semiconductor substrate 302 (e.g., a contact pad).

Figure 3B:
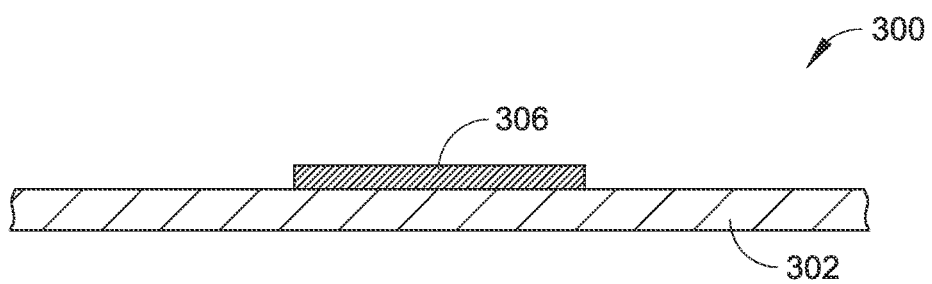

A top metal contact pad is deposited on the semiconductor substrate (Block 204). As illustrated in FIG. 3B, the top metal contact pad 306 is formed on the semiconductor substrate 302 and configured to function as an electrical interconnection between the semiconductor substrate 302 (e.g., an integrated circuit formed in the semiconductor substrate 302) and a redistribution layer structure 310. Additionally, depositing the top metal contact pad 306 may include depositing the top metal contact pad 306 on the semiconductor substrate 302 before formation of the passivation layer 304. In an implementation, forming the top metal contact pad 306 includes depositing the top metal contact pad 306 on the semiconductor substrate 302 before forming the passivation layer 304 and etching the passivation layer 304 to expose the top metal contact pad 306.

Figure 3C:
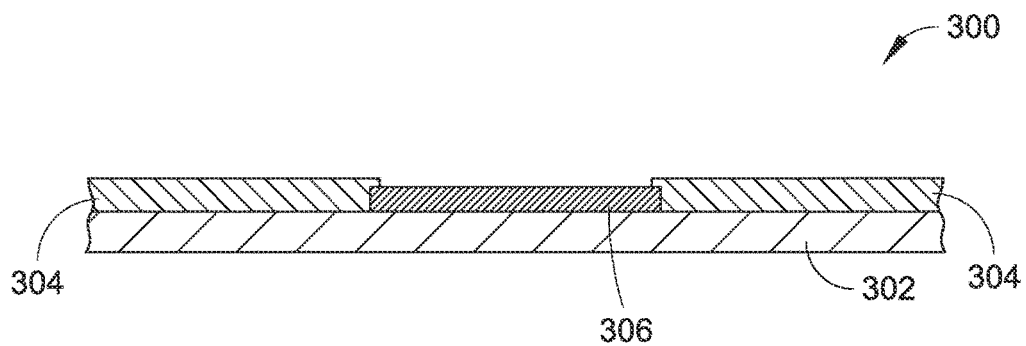

A passivation layer is formed on the semiconductor substrate (Block 206). FIG. 3C illustrates depositing a passivation layer 304 on the semiconductor substrate 302. Forming the passivation layer 304 may include utilizing one or more suitable deposition techniques, such as physical vapor deposition, chemical vapor deposition, molecular beam epitaxy, and so forth. In some implementations, forming the passivation layer 304 may further include an etching step to at least partially expose the semiconductor substrate 302 and/or a contact pad (e.g., the top metal contact pad 306). In an implementation, forming the passivation layer 304 includes forming and/or etching the passivation layer 304 after a top metal contact pad 306 is deposited on the semiconductor substrate 302. Forming the passivation layer 304 may include forming the passivation layer 304 subsequent to depositing a top metal contact pad 306 on the semiconductor substrate 302.

Figure 3D:
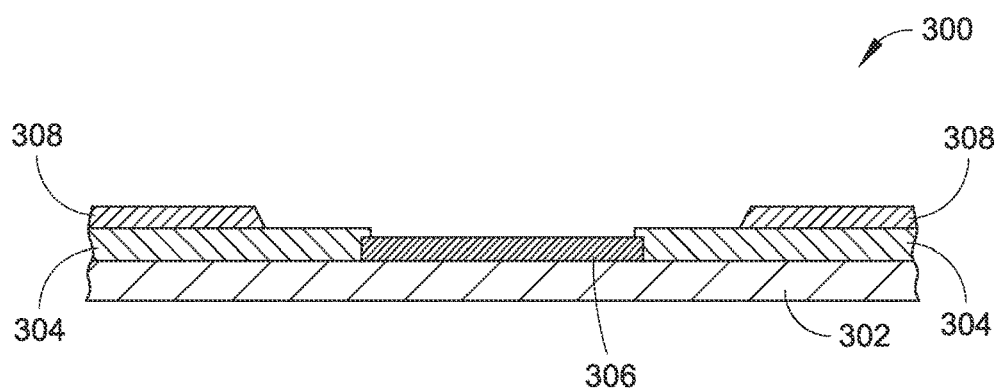

A thin film is formed on the passivation layer and the top metal contact pad (Block 208). As illustrated in FIG. 3D, a thin film 308 is formed on a portion of the passivation layer 304 leaving a portion of the passivation layer 304 closest to the top metal layer 306 exposed (e.g., the opening in the thin film 308 is larger than the opening in the passivation layer 304 and larger than the top metal contact pad 306). In implementations, forming the thin film 308 includes utilizing one or more suitable deposition techniques, for example, physical vapor deposition, chemical vapor deposition, molecular beam epitaxy, spin coating, and so forth. In implementations, the thin film 308 may comprise a suitable dielectric material, such as benzocyclobutene polymer (BCB), Polyimide (PI), Polybenzoxazole (PBO), silicon dioxide ($SiO_2$), other polymers, and so forth.

In an implementation, forming a thin film includes forming the thin film 308 by spin coating a layer of PBO onto the passivation layer 304 and the top metal contact pad 306. Spin coating includes dispensing a viscous, liquid solution of resist material onto the wafer, and the wafer is spun rapidly to produce a uniformly thick layer of the resist material. The spin coating process results in a uniform thin layer of resist material, often with uniformity of approximately 5 to 10 nanometers. As discussed above, other methods for forming the thin film 308 may be utilized. In one implementation, a thin film 308 is formed on a portion of a passivation layer 304, where the thin film 308 is subsequently etched and a via or an opening is formed therein. In this implementation, the via or opening may be configured so that a redistribution layer structure 310 may be formed in the via or opening. The via may include a small opening in a layer (e.g., passivation layer 304, thin film 308) that allows a conductive connection between different layers and may be formed using photolithography techniques (e.g., application of photoresist, etching the photoresist, and removing the photoresist).

Figure 3E:
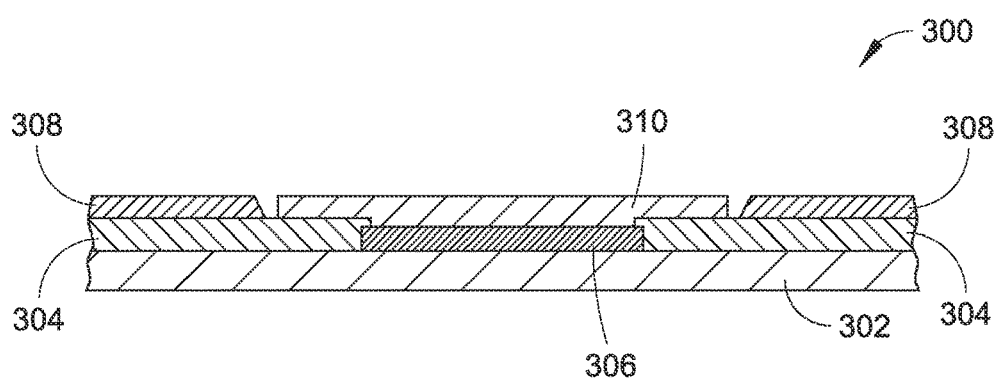

A redistribution layer structure is then deposited on the passivation layer, the top metal contact pad, and in a via or opening of the thin film (Block 210). As shown in FIG. 3E, the redistribution layer structure 310 is deposited in a patterned area (e.g, a via) of the thin film. Forming the redistribution layer structure 310 may include forming a redistribution layer as well as forming corresponding bonding pads, underbump metallization (UBM), through-silicon vias (TSVs) or through-chip vias, wiring and/or metal layers, and other electrical interconnections. In implementations, forming a redistribution layer structure 310 includes forming a redistribution layer that includes a UBM and a bonding pad. Further, forming the redistribution layer structure 310 may include forming a conductive material, such as polysilicon, or a metal, such as aluminum or copper, which may be applied over a portion of the passivation layer 304 and top metal contact pad 306.

In one specific implementation, forming the redistribution layer structure 310 includes depositing copper as the metal line in the redistribution layer structure 310. In this implementation, depositing a copper redistribution layer structure 310 may include using an electroplating process. Copper may be electrolytic plated by using external electrodes and applied current. Electroplating the copper may include mounting the wafer-level package device 100 on a cathode and immersed into a plating solution that contains copper ions. An inert anode (e.g., a platinum anode) is also immersed into the copper ionic solution. A voltage is applied between the two electrodes and the current drives the copper ions toward the wafer-level package device 100 thereby forming metallic copper (e.g., the metal lines of the redistribution layer structure 310) on the top metal contact pad 306. In other implementations, depositing a copper redistribution layer structure 310 may include electroless plating (i.e., deposition without an applied field), physical vapor deposition methods (e.g., sputtering, evaporation, etc.), and/or chemical vapor deposition. In another specific implementation, depositing the redistribution layer structure 310 includes sputtering a copper layer onto a portion of the passivation layer 304, the top metal contact pad 306, and in a via created in the thin film 308. Sputtering includes ejecting material from a target (i.e., the source of the material being deposited) onto a surface (e.g., the thin film 308, the passivation layer 304, and/or the top metal contact pad 306). Other materials, such as copper, silver, tungsten, aluminum, and alloys may also be suitable for use in depositing the redistribution layer structure 310. Additional processes that may be used in depositing the redistribution layer structure 310 may include lapping, chemical-mechanical planarization, and/or other polishing techniques.

Figure 3F:
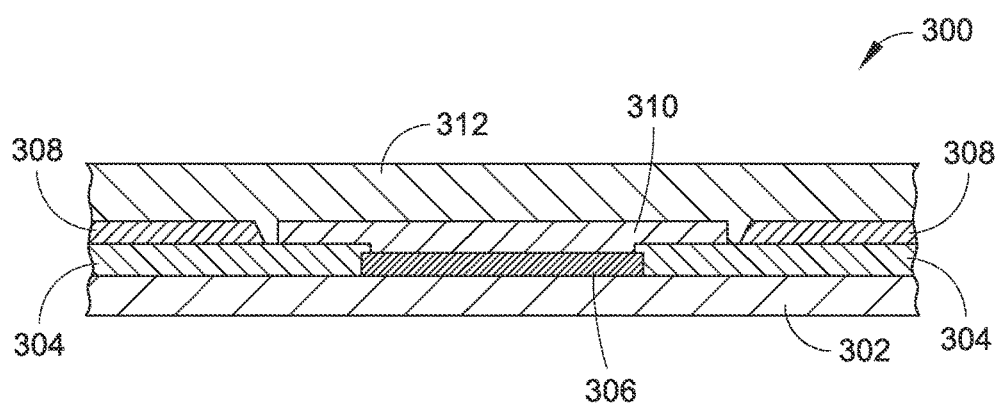

Next, a dielectric layer is formed over the thin film and redistribution layer structure (Block 212). As illustrated in FIG. 3F, a dielectric layer 312 is formed on the thin film 308 and redistribution layer structure 310. In implementations, the dielectric layer 312 functions as an electrical insulator as well as a support structure. Suitable dielectric materials may include a benzocyclobutene polymer (BCB), polyimide (PI), polybenzoxazole (PBO), silicon dioxide ($SiO_2$), a nitride ($Si_3N_4$) material, and so forth. In an implementation, forming a dielectric layer 312 includes forming a layer of polymer over the redistribution layer structure 310 and the thin film 308, where the dielectric layer 312 functions as electrical insulation and a structural support to subsequent layers of the wafer-level package device 100.

Once the dielectric layer 312 is formed, additional processes may be employed to add subsequent layers and segment the individual integrated circuit chips of the wafer-level package device 100 into individual semiconductor packages.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:
1. A wafer-level package device comprising:
a semiconductor substrate comprising one or more integrated circuits formed therein;
a top metal contact pad disposed in contact with the semiconductor substrate and configured to provide electrical contact between the one or more integrated circuits formed on the semiconductor substrate and one or more external components;
a passivation layer disposed in contact with the top metal contact pad and the semiconductor substrate;
a thin film disposed on the passivation layer and comprising a layer of electrical insulation, where a via formed in the thin film is larger than an opening in the passivation layer, the opening in the thin film and the opening in the passivation layer both disposed over the top metal contact pad;
a redistribution layer structure disposed on the top metal contact pad and at least a portion of the passivation layer, the redistribution layer structure disposed at least partially in the via formed in the thin film, where the redistribution layer structure substantially contacts a surface of the top metal contact pad distal from the semiconductor substrate, wherein contact between the redistribution layer structure and the top metal contact pad is a pad defined contact, wherein a gap is formed between the redistribution layer structure and the thin film, and wherein the redistribution layer is electrically isolated from the semiconductor substrate except for the top metal contact pad; and
a dielectric layer formed on the thin film and the redistribution layer structure.

2. The wafer-level package device as recited in claim 1, wherein the semiconductor substrate includes a processed silicon wafer.

3. The wafer-level package device as recited in claim 1, wherein the top metal contact pad includes a copper contact pad.

4. The wafer-level package device as recited in claim 1, wherein the thin film includes a film of polybenzoxazole (PBO).

5. The wafer-level package device as recited in claim 1, wherein the redistribution layer structure includes a redistribution layer that is in contact with a portion of the passivation layer.

6. The wafer-level package device as recited in claim 1, wherein the redistribution layer structure includes under-bump metallization.

7. The wafer-level package device as recited in claim 1, wherein the top metal contact pad has a size of 30 microns or less across.

8. The wafer-level package device as recited in claim 1, wherein the redistribution layer structure configured so that a contact area between the redistribution layer structure and the top metal contact pad is the same as a size of the via within the passivation layer.

9. An electronic device comprising:
a printed circuit board; and
a wafer level-package device coupled to the printed circuit board, the wafer-level package device including
a semiconductor substrate comprising one or more integrated circuits formed therein;
a top metal contact pad disposed in contact with the semiconductor substrate and configured to provide electrical contact between the one or more integrated circuits formed on the semiconductor substrate and one or more external components;
a passivation layer disposed in contact with the top metal contact pad and the semiconductor substrate;

a thin film disposed on the passivation layer and comprising a layer of electrical insulation, where a via formed in the thin film is larger than an opening in the passivation layer, the opening in the thin film and the opening in the passivation layer both disposed over the top metal contact pad;

a redistribution layer structure disposed on the top metal contact pad and at least a portion of the passivation layer, the redistribution layer structure disposed at least partially in the via formed in the thin film, where the redistribution layer structure substantially contacts a surface of the top metal contact pad distal from the semiconductor substrate, wherein contact between the redistribution layer structure and the top metal contact pad is a pad defined contact, wherein a gap is formed between the redistribution later and the thin film, wherein a gap is formed between the redistribution layer and the thin film, and wherein the redistribution layer is electrically isolated from the semiconductor substrate except for the top metal contact pad; and a dielectric layer formed on the thin film and the redistribution layer structure.

10. The electronic device as recited in claim 9, wherein the semiconductor substrate includes a processed silicon wafer.

11. The electronic device as recited in claim 9, wherein the top metal contact pad includes a copper contact pad.

12. The electronic device as recited in claim 9, wherein the thin film includes a film of polybenzoxazole (PBO).

13. The electronic device as recited in claim 9, wherein the redistribution layer structure includes a redistribution layer that is in contact with a portion of the passivation layer.

14. The electronic device as recited in claim 9, wherein the redistribution layer structure includes under-bump metallization.

15. The electronic device as recited in claim 9, wherein the top metal contact pad has a size of 30 microns or less across.

16. The electronic device as recited in claim 9, wherein the redistribution layer structure configured so that a contact area between the redistribution layer structure and the top metal contact pad is the same as a size of the via within the passivation layer.

\* \* \* \* \*